United States Patent
Yashima et al.

(10) Patent No.: US 11,777,518 B2
(45) Date of Patent: Oct. 3, 2023

(54) DATA COMPRESSION DEVICE, MEMORY SYSTEM AND METHOD

(71) Applicant: Kioxia Corporation, Tokyo (JP)

(72) Inventors: Daisuke Yashima, Tachikawa (JP); Youhei Fukazawa, Kawasaki (JP); Sho Kodama, Kawasaki (JP); Keiri Nakanishi, Kawasaki (JP); Masato Sumiyoshi, Yokohama (JP); Kohei Oikawa, Kawasaki (JP); Zheye Wang, Kawasaki (JP); Takashi Miura, Yokohama (JP)

(73) Assignee: Kioxia Corporation, Tokyo (JP)

( * ) Notice: Subject to any disclaimer, the term of this patent is extended or adjusted under 35 U.S.C. 154(b) by 29 days.

(21) Appl. No.: 17/653,513

(22) Filed: Mar. 4, 2022

(65) Prior Publication Data

US 2023/0070623 A1 Mar. 9, 2023

(30) Foreign Application Priority Data

Sep. 9, 2021 (JP) ................... 2021-146947

(51) Int. Cl.
*H03M 7/00* (2006.01)
*H03M 7/30* (2006.01)

(52) U.S. Cl.
CPC ....... *H03M 7/3088* (2013.01); *H03M 7/6011* (2013.01)

(58) Field of Classification Search
CPC ............ H03M 7/3088; H03M 7/6011; H03M 7/6023; H03M 7/6076

USPC ....................................................... 341/50, 51
See application file for complete search history.

(56) References Cited

U.S. PATENT DOCUMENTS

| | | | |
|---|---|---|---|
| 6,650,261 B2 | 11/2003 | Nelson et al. | |
| 6,674,908 B1 * | 1/2004 | Aronov | H03M 7/3088 382/248 |
| 8,704,686 B1 | 4/2014 | Agarwal et al. | |
| 9,203,887 B2 | 12/2015 | Gopal et al. | |
| 9,385,748 B2 | 7/2016 | Dalton et al. | |
| 10,128,868 B1 * | 11/2018 | Gopal | H03M 7/6011 |
| 10,187,081 B1 * | 1/2019 | Diamant | H03M 7/3088 |

FOREIGN PATENT DOCUMENTS

| | | |
|---|---|---|
| JP | 2003-179501 A | 6/2003 |
| JP | 2014-93612 A | 5/2014 |

* cited by examiner

*Primary Examiner* — Jean B Jeanglaude
(74) *Attorney, Agent, or Firm* — Oblon, McClelland, Maier & Neustadt, L.L.P.

(57) ABSTRACT

According to one embodiment, a data compression device includes a dictionary match determination unit, an extended matching generator, a match selector and a match connector. The dictionary match determination unit searches for first past input data matching first new input data. The extended matching generator compares second past input data subsequent to the first past input data with second new input data subsequent to the first new input data. The match selector generates compressed data by replacing a part of the input data with match information output from the dictionary match determination unit or the extended matching generator. The match connector replaces a plurality of match information in the compressed data with single match information.

14 Claims, 13 Drawing Sheets

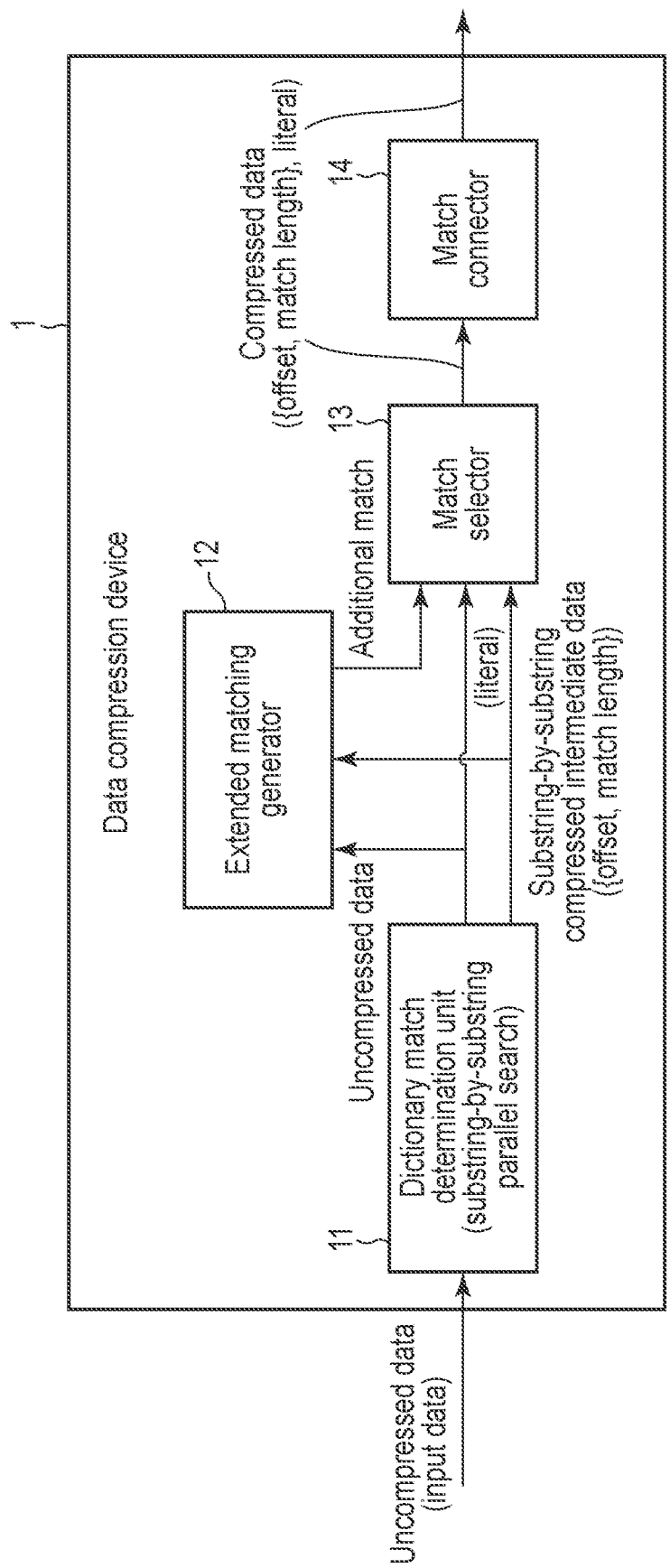
F I G. 1

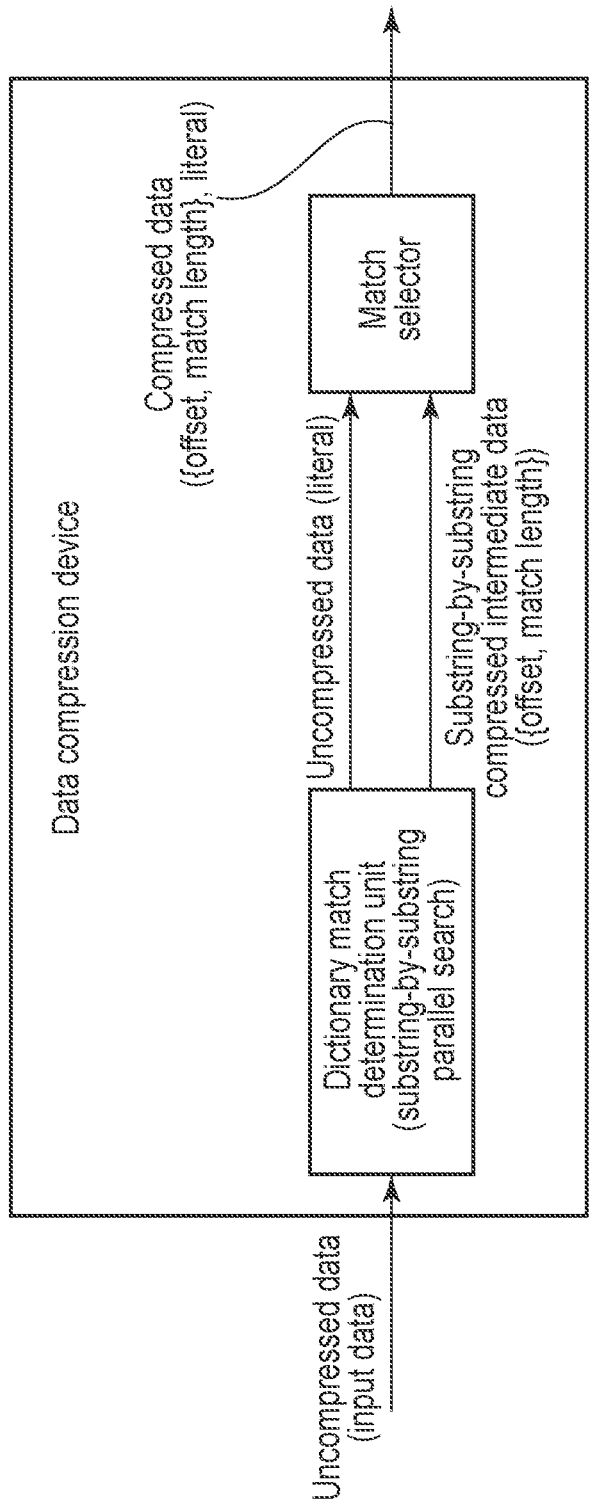
F I G. 2

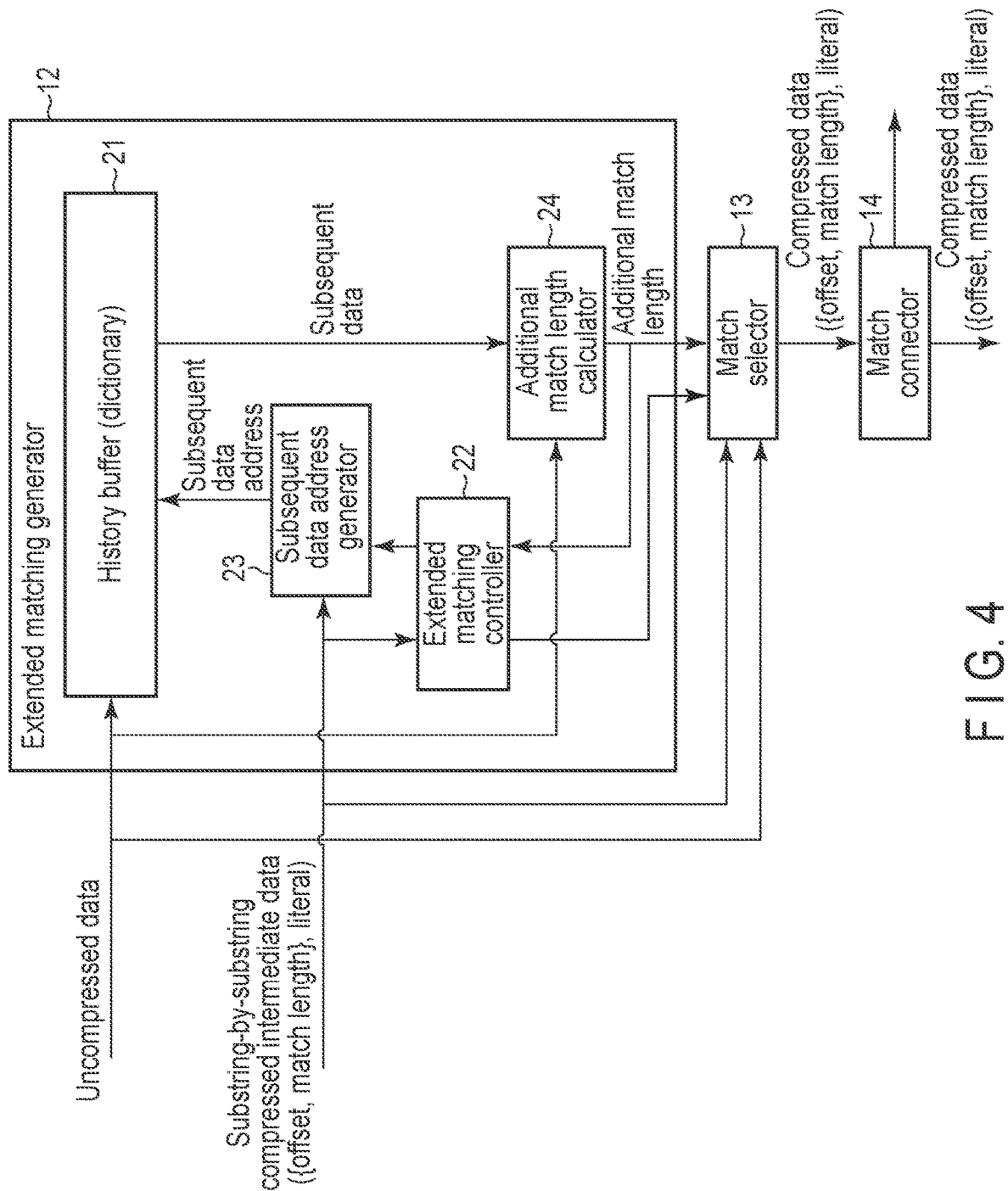
F I G. 4

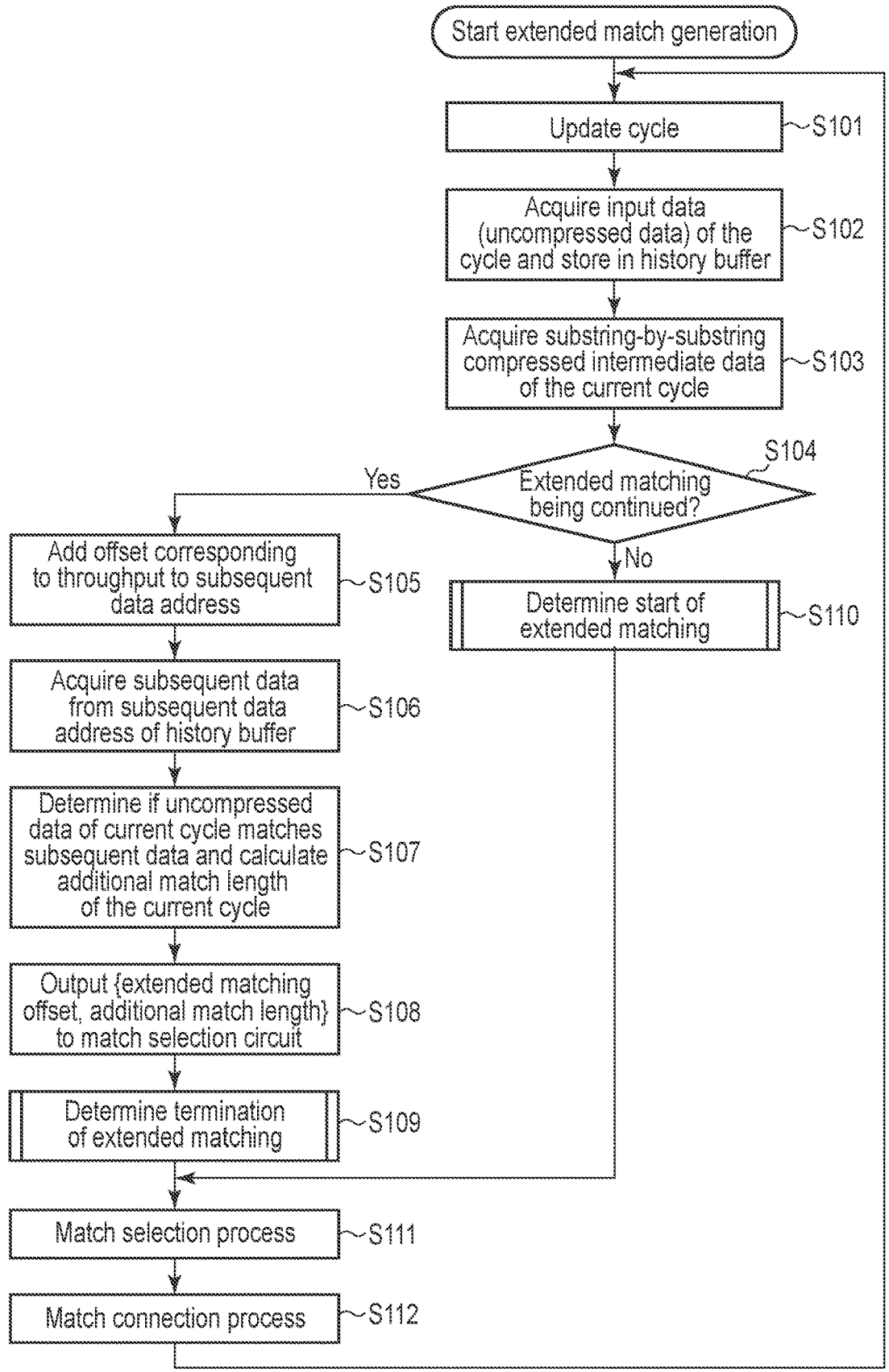
F I G. 7

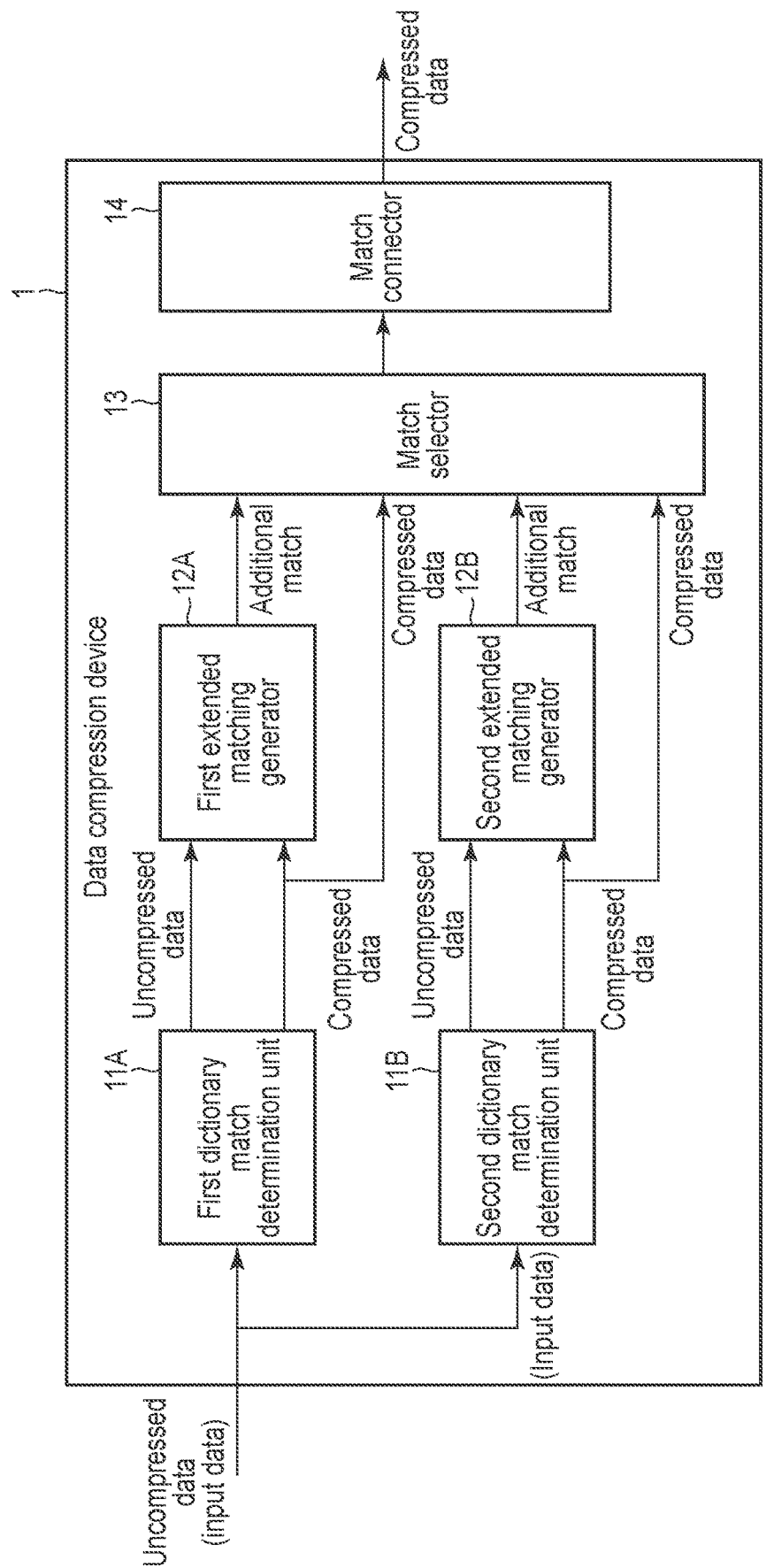
F I G. 10

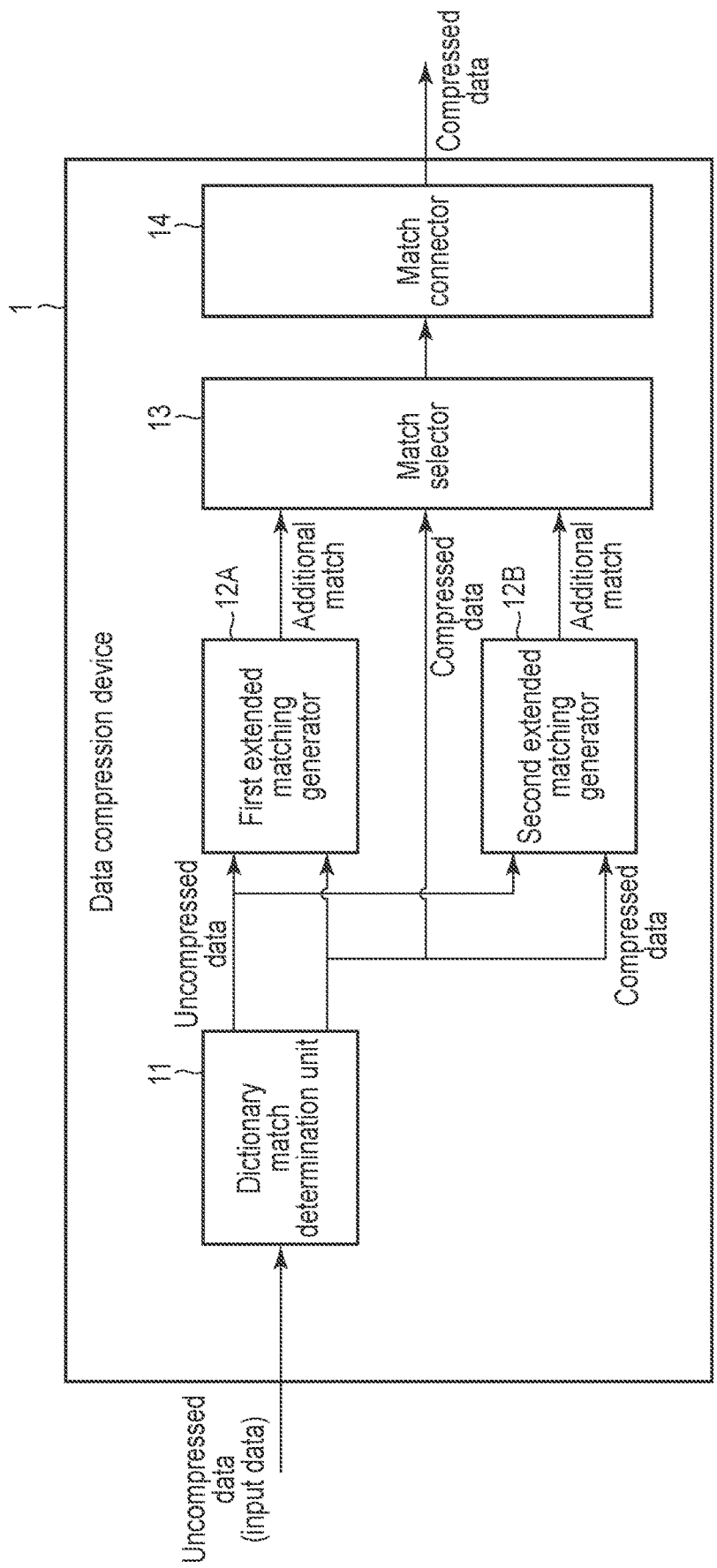
F I G. 11

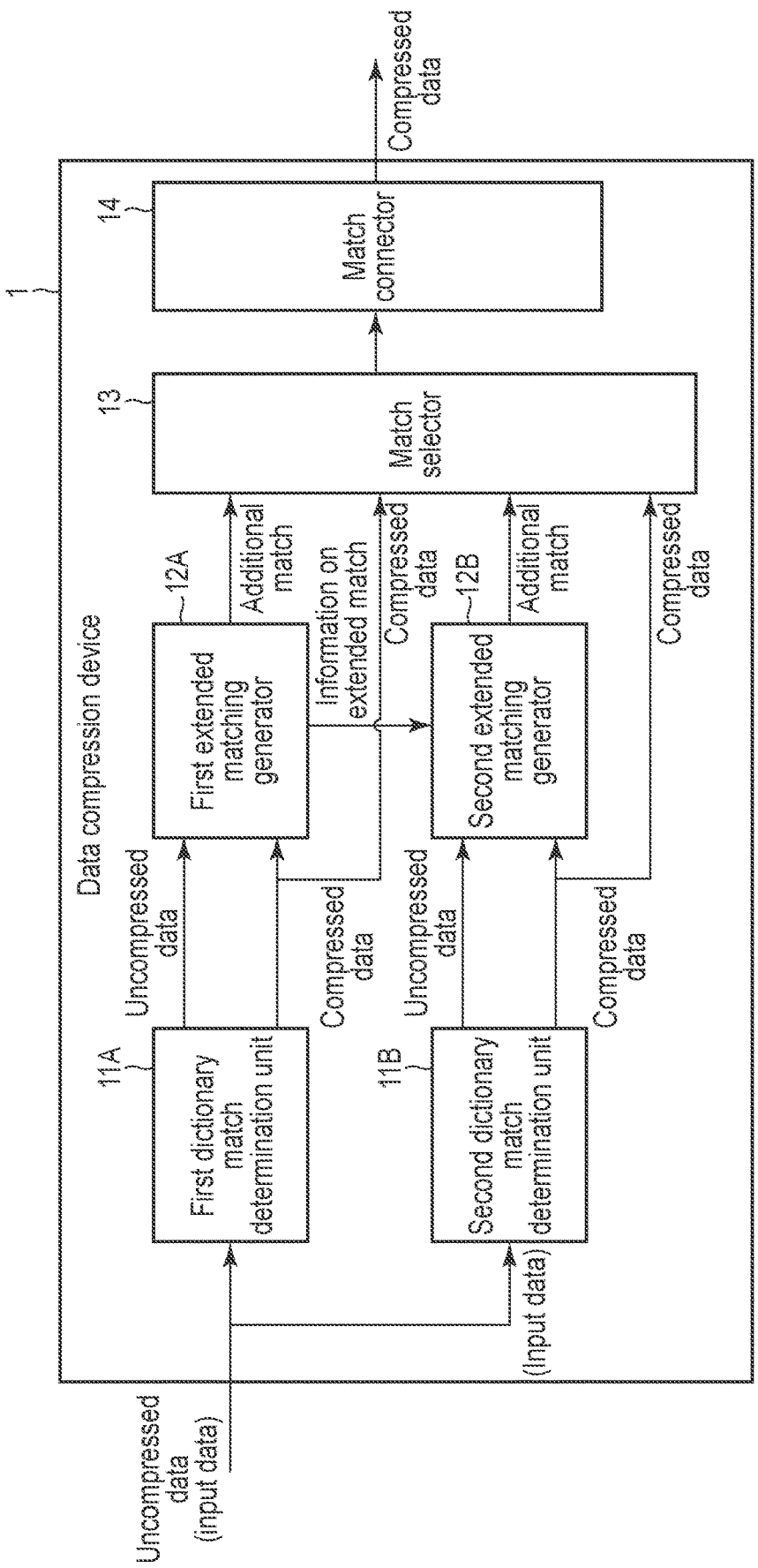
F I G. 12

DATA COMPRESSION DEVICE, MEMORY SYSTEM AND METHOD

CROSS-REFERENCE TO RELATED APPLICATIONS

This application is based upon and claims the benefit of priority from Japanese Patent Applications No. 2021-146947, filed Sep. 9, 2021, the entire contents of which are incorporated herein by reference.

FIELD

Embodiments described herein relate generally to a data compression device, a memory system and a method.

BACKGROUND

Dictionary encoding is known as one of data compression methods. In addition, a method of searching for a plurality of dictionary matches in parallel is known as a method for realizing high throughput compression in the dictionary encoding.

However, in the conventional parallel search method, a length of one search unit, referred to as a substring or the like, is an upper limit of a match length, and a high compression ratio is not expected.

BRIEF DESCRIPTION OF THE DRAWINGS

FIG. 1 is a diagram illustrating an example of functional blocks of a data compression device according to a first embodiment.

FIG. 2 is a diagram illustrating an example of functional blocks of a data compression device of a comparative example.

FIG. 4 is a diagram illustrating details of an extended matching generator of the data compression device according to the first embodiment.

FIG. 7 is a flowchart illustrating a flow of extended matching generation by the data compression device according to the first embodiment.

FIG. 10 is a diagram illustrating an example of functional blocks of a data compression device according to a second embodiment.

FIG. 11 is a block diagram of a variation of the data compression device according to the second embodiment.

FIG. 12 is a diagram illustrating an example of functional blocks of a data compression device according to a third embodiment.

DETAILED DESCRIPTION

Figure 3:
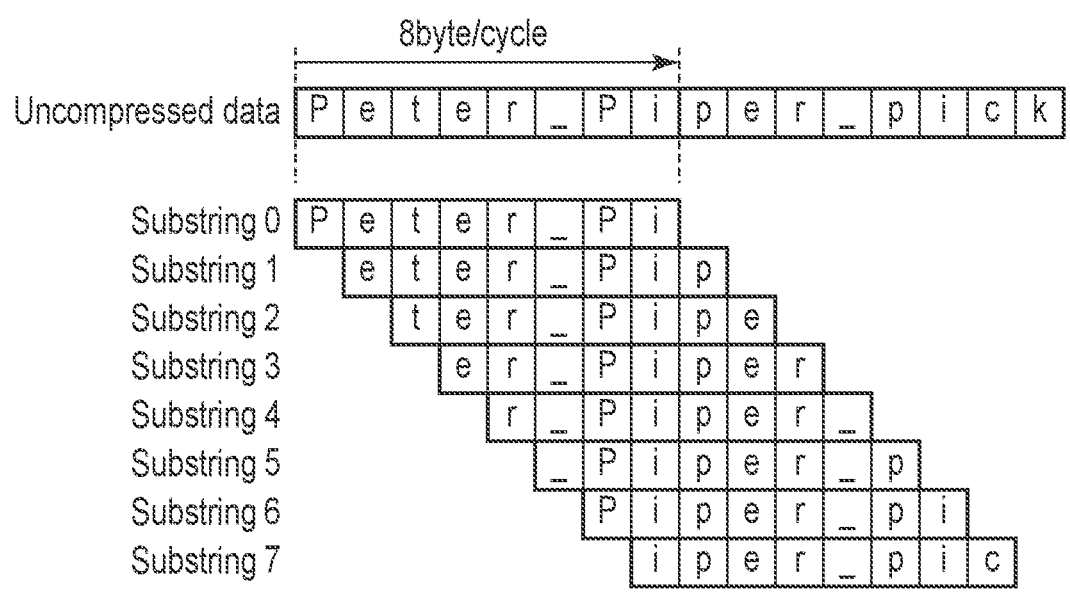
FIG. 3 is a diagram illustrating a configuration example of a substring.

Embodiments will be described hereinafter with reference to the accompanying drawings.

In general, according to one embodiment, a data compression device includes a dictionary match determination unit, an extended matching generator, a match selector and a match connector. The dictionary match determination unit sequentially stores input data in a history buffer, refers to the history buffer as a dictionary in which past input data is stored to search for a first piece of past input data matching a first piece of new input data in parallel for N (N is a natural number equal to or greater than 2) sequences of search units each having a length of N times one data length, each head of the first piece of new input data being shifted by the one data length, and outputs match information including a relative position from the first piece of new input data indicating a position of the first piece of past input data matching the first piece of new input data on the history buffer and a match length from the head. When at least one match information is output from the dictionary match determination unit and the at least one match information includes the match information of which the match length is N times the one data length, the extended matching generator selects the match information of which the match length is N times the one data length from the at least one match information, compares a second piece of past input data subsequent to the first piece of past input data indicated by the match information with a second piece of new input data subsequent to the first piece of new input data of a sequence for which the match information has been output, and outputs the match information including a relative position from the second piece of new input data subsequent to the first piece of new input data indicating a position of the second piece of past input data subsequent to the first piece of past input data on the history buffer and a match length from the head. The match selector generates compressed data by replacing a part of the input data with the match information using the match information output from the dictionary match determination unit and the match information output from the extended matching generator. When a plurality of match information are consecutive in the compressed data generated by the match selector and the plurality of match information each have the relative position of an identical value, the match connector replaces the plurality of match information in the compressed data with single match information including a relative position of the identical value and a match length obtained by summing the match length of each of the plurality of match information.

First Embodiment

A first embodiment will be described.

FIG. 1 is a diagram illustrating an example of functional blocks of a data compression device 1 according to the first embodiment. The data compression device 1 is a data compression device that performs dictionary encoding. In the dictionary encoding, a data history is held by storing past data in a dictionary buffer, and a code amount is reduced by replacing a new data string with information indicating where data that the new data string matches is located in the dictionary (an offset) and how long the new data string matches the data (a match length).

As illustrated in FIG. 1, the data compression device 1 includes a dictionary match determination unit 11, an extended matching generator 12, a match selector 13, and a match connector 14. These are implemented as hardware such as electric circuits. Note that these can also be implemented by a processor (not illustrated) mounted on the data compression device 1 executing a program.

Here, first, a data compression device of a comparative example with respect to the data compression device 1 will be described. FIG. 2 is a diagram illustrating an example of functional blocks of the data compression device of the comparative example.

A dictionary match determination unit receives uncompressed data as input to perform a substring-by-substring parallel search, and outputs a match in a dictionary (match information) for each substring. FIG. 3 is a diagram illustrating a configuration example of the substring.

The dictionary match determination unit configures the substrings from, for example, data of two cycles. The substrings each have a length corresponding to throughput and are configured by shifting head data by one piece of data for each of sequences as many as the number corresponding to the throughput every cycle. In the example illustrated in FIG. 3, one cycle is 8 bytes, and substrings having a length of 8 bytes are configured for 8 sequences every cycle from 16 bytes of input data (uncompressed data).

For example, the dictionary match determination unit performs a parallel search for the substrings configured as illustrated in FIG. 3 to perform searches for all the input data of the length corresponding to the throughput, the input data being shifting by one piece of data for each search. A search for the substring is a search for a match of the substring from the head data. A match of the substring from the middle is not required to be searched for, and is searched for as a match of another substring from the head data.

A match includes an offset (relative position) and a match length. All the input data is not always covered by matches resulted from the search, and thus the dictionary match determination unit also outputs uncompressed data to which the dictionary encoding has not been applied. This uncompressed data is described as a literal. The outputs from the dictionary match determination unit are input to a match selector in a subsequent stage.

The match selector selects any one of the matches obtained for the respective substrings to configure compressed data for one cycle. There are considered, as the match selection, a method of selecting a match as long as possible, a method of selecting a match such that the total code amount of one cycle is expected to be small, and the like. When compressed data is not configured such that all the input data is covered by the matches, the match selector uses the uncompressed data as a literal as it is for a piece of data that is not covered by the matches.

In a case where the dictionary encoding reduces the code amount, if a dictionary match having a longer match length can be selected, more pieces of data will be replaced with one set of (offset, match length), and improvement in the compression ratio (improvement in compression performance) can be expected. Here, it is assumed that "compression ratio=original data size/encoded data size". It is also assumed that the offset is a relative position on the dictionary with respect to encoding target data.

In the data compression device of the comparative example, the parallel search realizes high throughput. However, the match length to be obtained has an upper limit that is the length of each substring, and a high compression ratio by supporting a long match length is not expected.

Based on the above description, returning to FIG. 1, the data compression device 1 according to the first embodiment will be further described.

The dictionary match determination unit 11 has a function similar to that of the dictionary match determination unit of the comparative example. The dictionary match determination unit 11 includes a history buffer (dictionary) therein, connects input data of a plurality of cycles to configure substrings as illustrated in FIG. 3, for example, and searches for a match on a substring-by-substring basis. The dictionary match determination unit 11 outputs substring-by-substring compressed intermediate data configured as a set of (offset, match length). The dictionary match determination unit 11 also outputs uncompressed data. Note that, details of the match search in the present embodiment may not be the same as those of the comparative example. The dictionary match determination unit 11 is required to generate and output a substring-by-substring match for uncompressed input data.

The extended matching generator 12 receives the uncompressed data and the compressed intermediate data output from the dictionary match determination unit 11, searches for an additional match that may be connected to the match of a previous cycle, and outputs the additional match to the match selector 13. FIG. 4 illustrates details of extended matching generator 12.

As illustrated in FIG. 4, the extended matching generator 12 includes a history buffer 21, an extended matching controller 22, a subsequent data address generator 23, and an additional match length calculator 24.

The history buffer 21 stores the uncompressed data received from the dictionary match determination unit 11.

Figure 5:
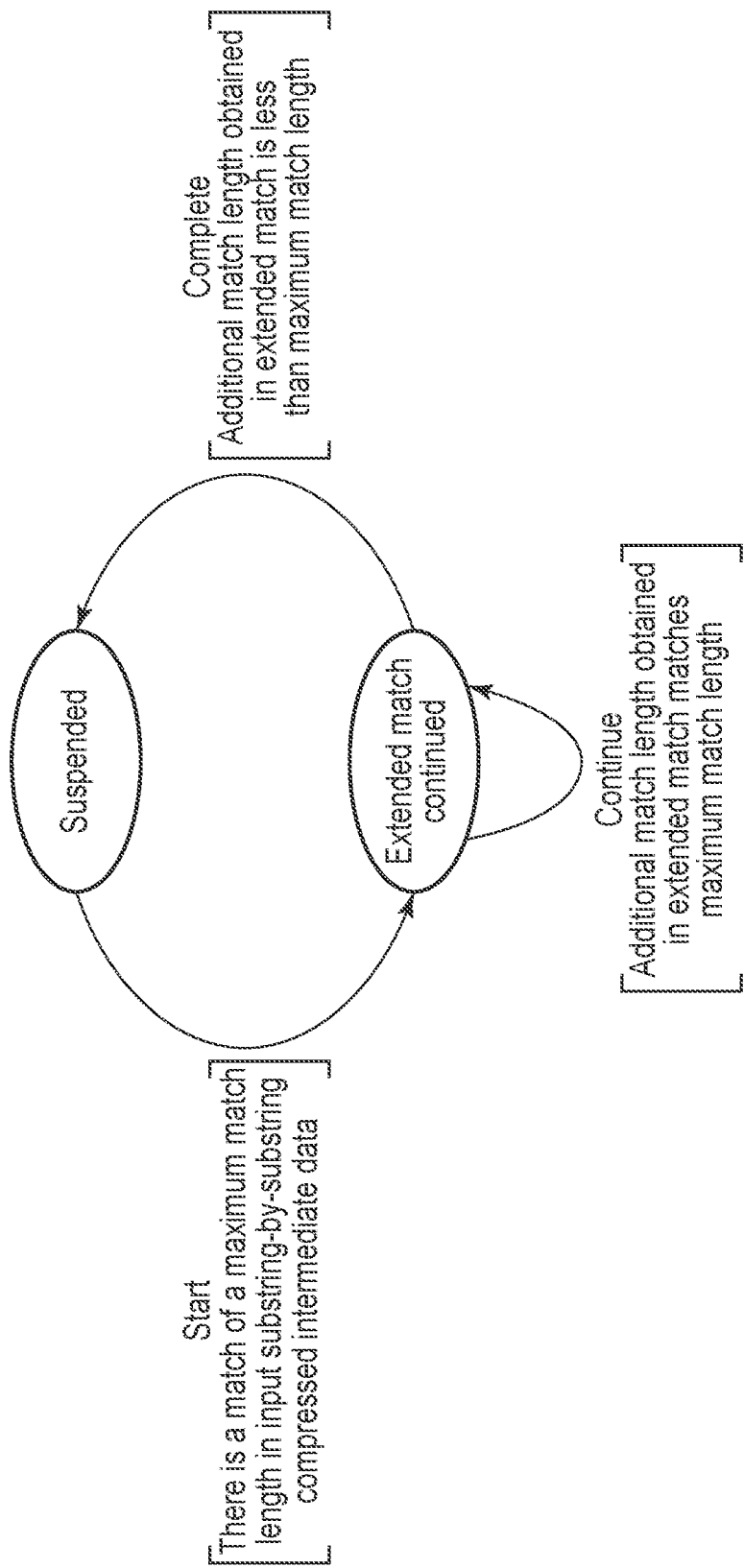
FIG. 5 is a state transition diagram of extended matching in the data compression device according to the first embodiment.

The extended matching controller 22 determines start, continuation, or end of extended matching, and controls entire operation of the extended matching generator 12. FIG. 5 is a state transition diagram of the extended matching.

Start condition of the extended matching is specified as a case where the extended matching is not currently being continued and there is a match of a maximum match length in the input substring-by-substring compressed intermediate data. Continuation condition of the extended matching is specified as a case where the extended matching is currently being continued and an additional match length obtained by an extended matching generation process agrees with the maximum match length. End condition of the extended matching is specified as a case where the additional match length obtained by the extended matching generation process is smaller (shorter) than the maximum match length.

The extended matching controller 22 holds a number and the offset of a substring that satisfies the start condition, and outputs the number and the offset as information of the extended matching to the match selector 13 in a subsequent stage. Further, the extended matching controller 22 outputs notification of start of the extended matching and the substring number to the subsequent data address generator 23.

The subsequent data address generator 23 generates an address that is referred to in the dictionary for the extended matching process. The subsequent data address generator 23 selects, at the start of the extended matching, a substring of which match has the maximum match length, and calculates a reference address of the match from the offset of the match, a current write address of the history buffer, and the substring number. The subsequent data address generator 23 further adds an address corresponding to the throughput to generate a reference address of subsequent data of the match. The subsequent data address generator 23 adds, during the continuation of the extended matching, the number of pieces of data corresponding to the throughput to the current subsequent data address to generate a next subsequent data address.

The subsequent data address generator 23 inputs the generated subsequent data address to the history buffer 21. The history buffer 21 outputs the subsequent data of the match based on the subsequent data address.

The additional match length calculator 24 compares the subsequent data of the match from the history buffer 21 with the uncompressed data from the dictionary match determination unit 11 to calculate a match length from head data. The additional match length calculator 24 outputs this match length as an additional match length. The additional match length is input to the match selector 13 in a subsequent stage and is input to the extended matching controller 22. The extended matching controller 22 determines continuation or end of the extended matching using this additional match length.

In the present embodiment, the extended matching generator 12 includes the history buffer 21 therein. The dictionary match determination unit 11 also has the history buffer storing the same data. If the history buffer in the dictionary match determination unit 11 comprises a reading port for the extended matching generation and there is a margin in a cycle, the history buffer in the dictionary match determination unit 11 may be shared to be referred to by the extended matching generator 12.

The match selector 13 has a function similar to that of the match selector of the comparative example. In the comparative example, substring-by-substring matches are selected to generate compressed data for one cycle. Meanwhile, in the present embodiment, matches are selected from an additional match including the additional match length and the offset and substring-by-substring matches generated by the dictionary match determination unit 11 to generate compressed data for one cycle. At that time, the additional match is treated as having the substring number input from the extended matching generator 12, and has a higher priority to be applied than the matches generated by the dictionary match determination unit 11. The match selector 13 generates compressed data by replacing a piece of data capable of being replaced with a match in the input data with the match. The match selector 13 applies uncompressed data (a literal) obtained by delaying the input data to a piece of data incapable of being replaced with a match.

When there are consecutive matches without literals therebetween and the offsets thereof are the same, the match connector 14 replaces the consecutive matches with a new match obtained by summing the two match lengths. Note that, in a case where a match length has an upper limit, a total value of the match lengths is limited not to exceed the upper limit.

Figure 6:
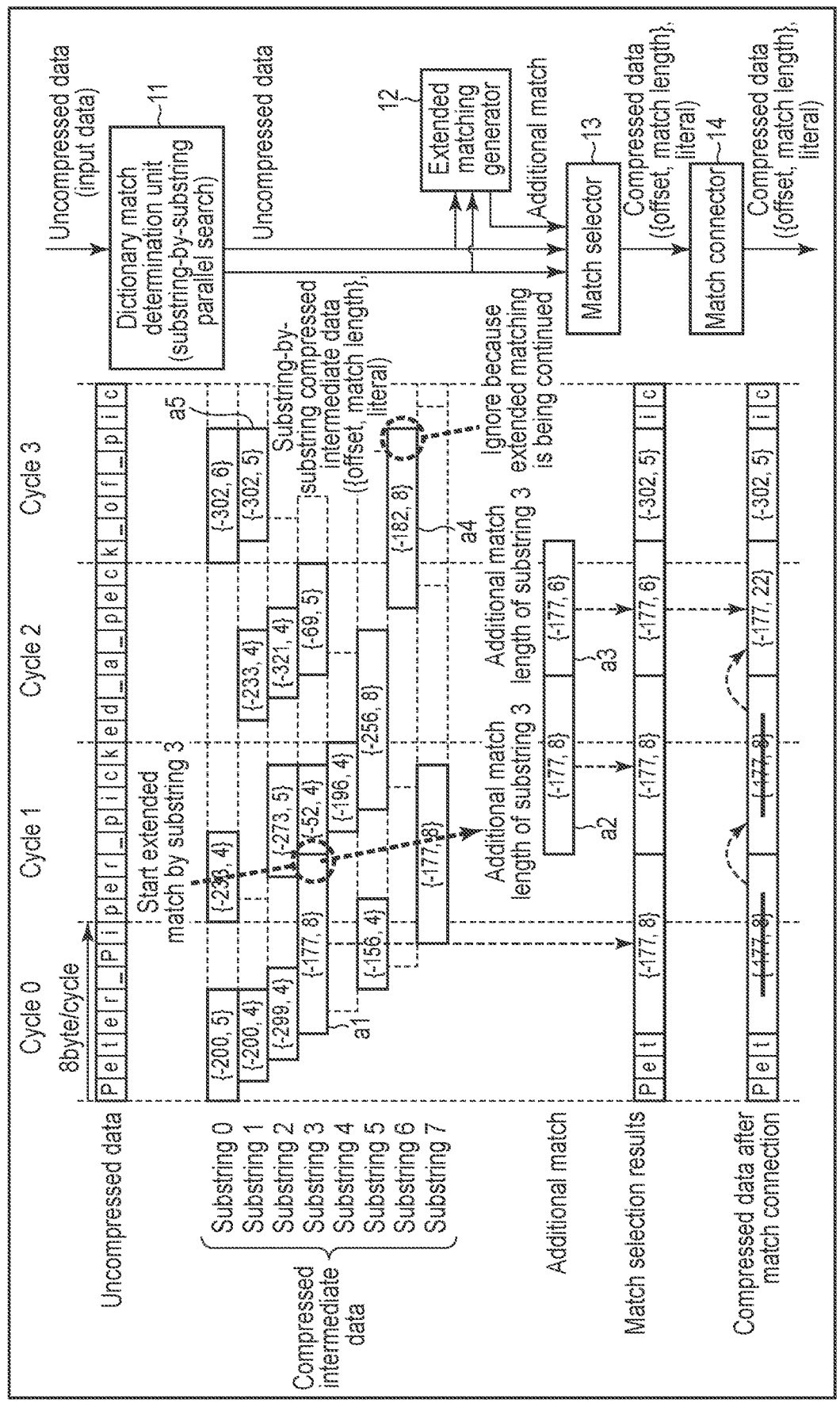
FIG. 6 is a diagram illustrating match transition in the data compression device according to the first embodiment.

FIG. 6 is a diagram illustrating match transition in the data compression device 1 according to the first embodiment.

A block diagram on the right side of FIG. 6 shows the configuration diagram of FIG. 4 vertically. In an 8 bytes/cycle example on the left side of FIG. 6, the transition in which a match is detected from uncompressed input data of a certain cycle to be selected is shown such that the transition is propagated from top to bottom in accordance with the block diagram on the right side with a vertical dashed line indicating a cycle break. Note that this diagram is not a normal timing chart and does not represent a pipeline delay or the like.

A bold box represents a match of {offset, match length}. For example, {-200, 5} indicates that 5 bytes of matching data is located 200 bytes ahead. First, substring-by-substring matches are generated from uncompressed input data through the dictionary match determination unit 11. Each substring has a start position shifted by 1 byte, and the dictionary match determination unit 11 detects a match of each substring from the head byte. A match is searched for each substring across a cycle boundary except for a substring of substring number 0. The maximum match length is 8 bytes, which corresponds to the throughput. For example, a match result in cycle 0 shows that matches of six substrings are detected and two of the matches indicate the maximum match length of 8. The extended matching generator 12 selects, for example, substring number 3 that is a smaller substring number among the two substrings each of which the match indicates the maximum match length to start the extended matching (a1). In cycle 1, the dictionary match determination unit 11 continues to detect a match, and in parallel with this, the extended matching generator 12 performs match length determination of an additional match. This match length determination is performed with respect to the offset of the match of substring number 3. Here, determining that a match length of 8 that is the same as the maximum match length is detected (a2), the extended matching generator 12 continues the extended matching. Also in cycle 2, the match length determination is performed with respect to the same offset of the match of substring number 3. Here, determining that a match length of 6 that is less than the maximum match length is detected (a3), the extended matching generator 12 ends the extended matching. In cycle 2, the match of substring number 6 having the match length of 8 that is the same as the maximum match length is detected (a4), but the extended matching generator 12 ignores the detection since the extended matching is being continued.

The match selector 13 generates compressed data from the substring-by-substring compressed intermediate data and the additional match. In cycle 0, no additional matches exist, and substring number 3 of which the match has the maximum match length is selected (a1). In cycles 1 and 2, additional matches exist and are selected (a2, a3). In cycle 3, substring number 1 of which the match starts at a byte position next to where the extended matching is ended is selected (a5). Bytes not filled with any match include uncompressed data as a literal as it is on the compressed data. The match connector 14 receives the compressed data generated in this manner as input and combines consecutive matches of which the offsets are the same. In cycle 0, there are no matches in particular to be combined. In cycle 1, the matches of cycles 0 and 1 are consecutive and have the same offset, so that the match connector 14 connects the matches to generate a match of {-177, 16}. In cycle 2, the connected match of cycle 1 and the match of cycle 2 are consecutive and have the same offset, so that the match connector 14 connects the matches to generate a match of {-177, 22}. In cycle 3, the offsets of the consecutive matches are different, so that the match connector 14 does not connect the matches and outputs {-302, 5} as it is.

FIG. 7 is a flowchart illustrating a flow of extended matching generation by the data compression device 1 according to the first embodiment.

When the cycle is updated (S101), the data compression device 1 acquires input data (uncompressed data) of the current cycle and stores the input data in the history buffer (S102). The data compression device 1 acquires substring-by-substring compressed intermediate data of the current cycle (S103).

Figure 8:
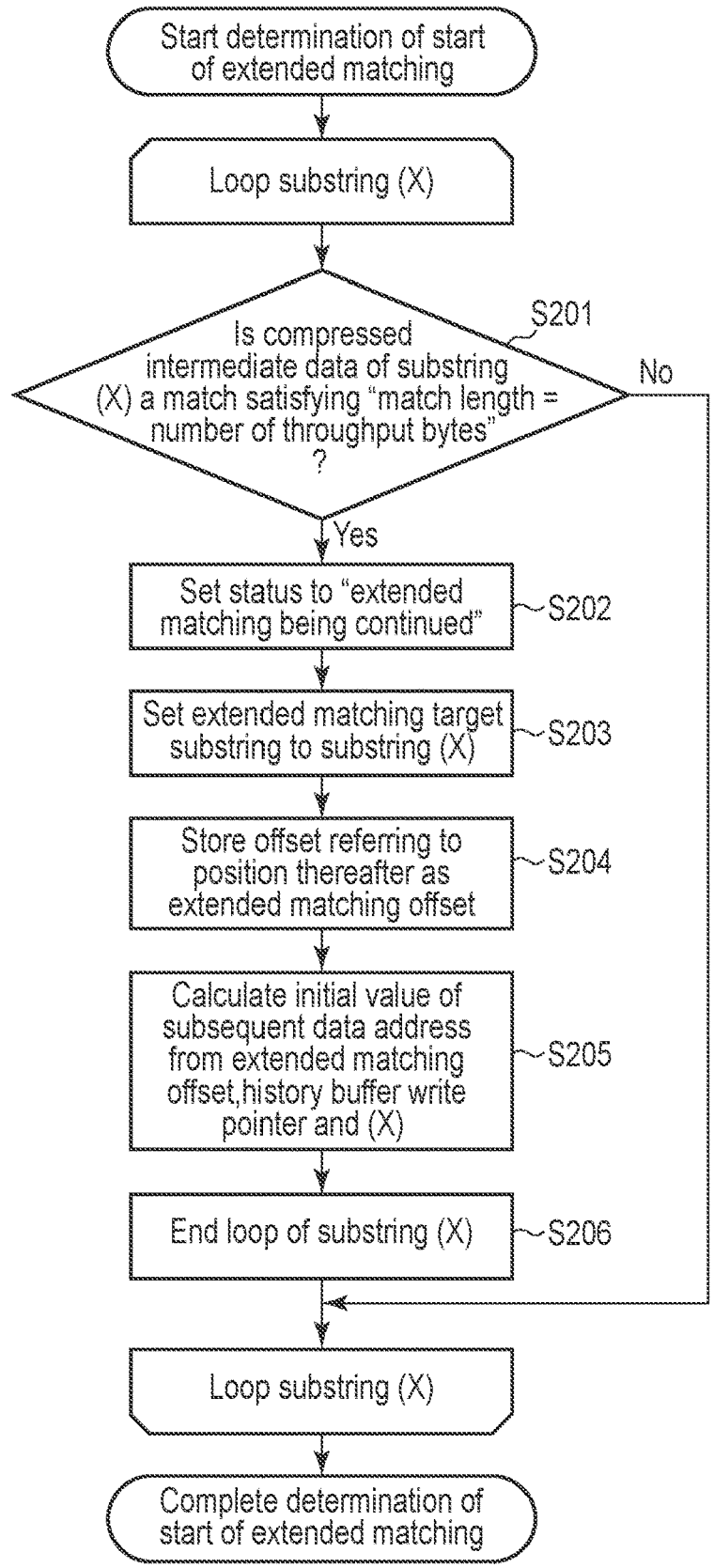
FIG. 8 is a flowchart illustrating a flow of start determination of extended matching in FIG. 7.

The data compression device 1 determines whether or not an extended matching state (status) is "extended matching being continued" (S104). When the extended matching is not being continued (No in S104), the data compression device 1 performs start determination of the extended matching (S110). FIG. 8 is a flowchart illustrating a flow of the start determination of the extended matching.

The data compression device 1 performs following processing on each substring (X).

The data compression device 1 determines whether or not the compressed intermediate data of a substring (X) is a match satisfying "match length=number of throughput bytes" (S201). When this condition is not satisfied (No in S201), the data compression device 1 ends the processing on the substring (X).

When the above condition is satisfied (Yes in S201), the data compression device 1 sets the status to "extended matching being continued" (S202). In addition, the data compression device 1 sets an extended matching target substring to the substring (X) (S203).

The data compression device 1 stores an offset referring to a position after the match of the substring (X) as an extended matching offset (S204). The data compression device 1 calculates an initial value of a subsequent data address used in the search in the extended matching from the extended matching offset, a history buffer write pointer indicating a write position of the new input data on the history buffer, and the substring (X) as the extended matching target substring (S205). When completing the processes of S202 to S205, the data compression device 1 ends the processing on the substring (X) (S206).

When completing the start determination of the extended matching in S110, the data compression device 1 performs a match selection process (S111), then performs a match connection process (S112), and returns to the first process of S101.

On the other hand, when the extended matching state (status) is "extended matching being continued" (S104: Yes), the data compression device 1 adds an offset corresponding to the throughput to the subsequent data address (S105). The data compression device 1 acquires subsequent data from the subsequent data address of the history buffer (S106).

Figure 9:
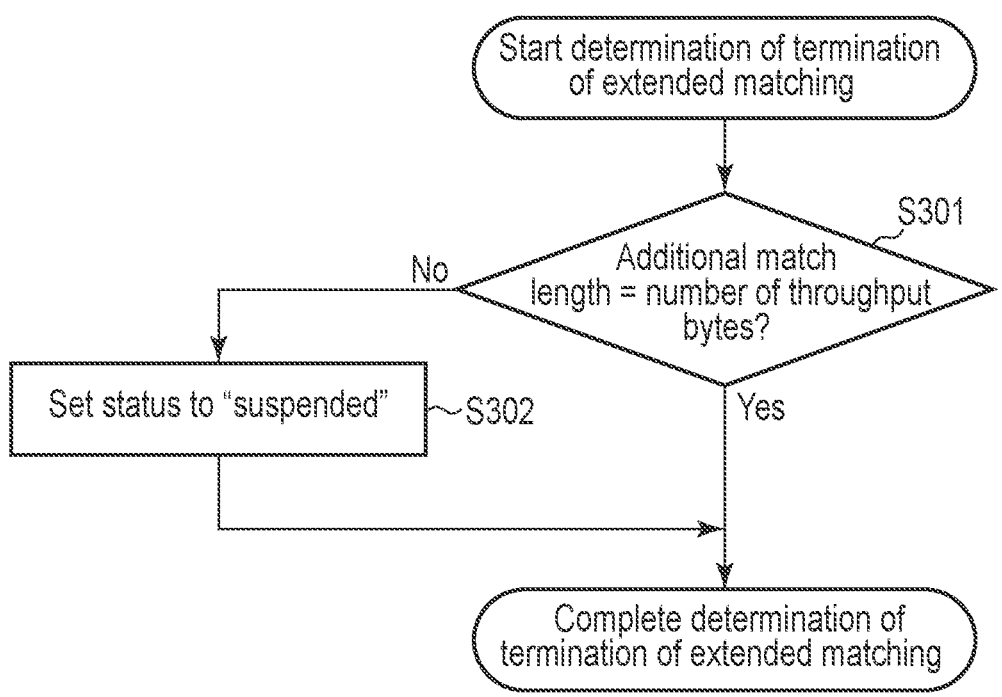
FIG. 9 is a flowchart illustrating a flow of termination determination of extended matching in FIG. 7.

The data compression device 1 compares the uncompressed data of the current cycle with the subsequent data to perform match determination, and calculates an additional match length of the current cycle (S107). The data compression device 1 outputs an additional match {extended matching offset, additional match length} to the match selection circuit (match selector 13) (S108). Then, the data compression device 1 performs termination determination of the extended matching (S109). FIG. 9 is a flowchart illustrating a flow of the termination determination of the extended matching.

The data compression device 1 determines whether or not the additional match length of the additional match is the number of the throughput bytes (S301). When "additional match length=number of throughput bytes" is satisfied (Yes in S301), the data compression device 1 maintains the status as "extended matching being continued" doing nothing, and ends the termination determination of the extended matching.

On the other hand, when "additional match length=number of throughput bytes" is not satisfied (No in S301), the data compression device 1 sets the status to "suspended" (S302), and ends the termination determination of the extended matching.

When completing the termination determination of the extended matching in S109, the data compression device 1 performs the match selection process (S111), then performs the match connection process (S112), and returns to the first process of S101.

As described above, in the data compression device 1 according to the first embodiment, compression ratio performance is improved by computing a match length exceeding the maximum match length obtained in the parallel search in unit time.

In addition, in a case where the extended matching generator 12 includes the history buffer 21, the access to the history buffer of the dictionary match determination unit 11 can be reduced. If the number of accesses to the history buffer per unit time is finite, more accesses to the history buffer can be used for the match search in the dictionary match determination unit 11. Thus, the compression ratio performance is improved. On the other hand, in a case where the extended matching generator 12 does not include the history buffer 21, circuit scale of the data compression device 1 can be reduced.

Second Embodiment

Next, a second embodiment will be described. FIG. 10 is a diagram illustrating an example of functional blocks of a data compression device 1 according to the second embodiment.

The data compression device 1 according to the second embodiment includes a plurality of dictionary match determination units 11 (a first dictionary match determination unit 11A, a second dictionary match determination unit 11B) and a plurality of extended matching generators 12 (a first extended matching generator 12A, a second extended matching generator 12B).

The first dictionary match determination unit 11A and the second dictionary match determination unit 11B desirably output different results and thus desirably use different algorithms or parameters. However, details of the algorithms will not be described here.

The first dictionary match determination unit 11A and the second dictionary match determination unit 11B each perform substring-by-substring dictionary compression and each output compressed intermediate data. The first extended matching generator 12A generates an additional match by extended matching from the compressed intermediate data of the first dictionary match determination unit 11A. The second extended matching generator 12B generates an additional match by extended matching from the compressed intermediate data of the second dictionary match determination unit 11B.

A match selector 13 receives two sets of the compressed intermediate data and the two additional matches as input, and selects matches from these matches to generate one piece of compressed data. A match connector 14 receives the compressed data output from the match selector 13 as input and, when consecutive matches have the same offset, connects the matches.

The data compression device 1 according to the second embodiment includes the dictionary match determination units 11 in parallel, allowing for obtaining more pieces of match information and more candidates for the match selection. Therefore, the compression ratio can be improved.

FIG. 11 is a block diagram of a variation of the data compression device 1 according to the second embodiment. While the data compression device 1 of FIG. 10 includes the plurality of dictionary match determination units for the same uncompressed data, a data compression device 1 of FIG. 11 includes one dictionary match determination unit 11 for the uncompressed data and includes the plurality of extended matching generators 12 in a subsequent stage thereof.

The dictionary match determination unit 11 performs substring-by-substring dictionary compression and outputs compressed intermediate data. The two extended matching generators 12 (the first extended matching generator 12A, the second extended matching generator 12B) in the subsequent stage each generate an additional match by extended matching from the compressed intermediate data of a different substring. The different substring means, for example, substrings included in half of a plurality of sequences output by the dictionary match determination unit 11 with respect to substrings included in the remaining half. Alternatively, the different substring means, for example, when matches having the maximum match length have been searched for two substrings, one of the two substrings with respect to the other.

The match selector 13 receives a set of the compressed intermediate data and the two additional matches as input, and selects matches from these matches to generate one piece of compressed data. The match connector 14 receives the compressed data output from the match selector 13 as input and, when consecutive matches have the same offset, connects the matches.

The data compression device 1 of the variation includes the plurality of extended matching generators 12 in parallel for the one dictionary match determination unit 11, allowing for searching for an additional match for more pieces of match information and obtaining more candidates for the match selection. Therefore, the compression ratio can be improved.

Third Embodiment

Next, a third embodiment will be described. FIG. 12 is a diagram illustrating an example of functional blocks of a data compression device 1 according to the third embodiment.

Like the data compression device 1 according to the second embodiment, the data compression device 1 according to the third embodiment includes a plurality of dictionary match determination units 11 (a first dictionary match determination unit 11A, a second dictionary match determination unit 11B) and a plurality of extended matching generators 12 (a first extended matching generator 12A, a second extended matching generator 12B). A difference from the data compression device 1 according to the second embodiment is that, in the data compression device 1 according to the third embodiment, the two extended matching generators 12 transmit and receive information regarding an additional match to be searched for to and from each other.

The first dictionary match determination unit 11A and the second dictionary match determination unit 11B are expected to output different results by using different algorithms or parameters. However, both dictionary match determination units operate independently, and have a good chance to detect the same match. At this time, if the two extended matching generators 12 (the first extended matching generator 12A, the second extended matching generator 12B) search for an additional match for the same match, only the same result is obtained. Thus, the two extended matching generators 12 transmit and receive information regarding the additional match to be searched for to and from each other to search for an additional match for a different match.

The data compression device 1 according to the third embodiment includes the extended matching generators 12 in parallel, allowing for searching for an additional match for more pieces of match information. In addition, even if the additional match is searched for respective pieces of match information from the plurality of dictionary match determination units 11, it is possible to eliminate duplicate search and thus to obtain more candidates for the match selection. Therefore, the compression ratio can be improved.

Application Example

Figure 13:
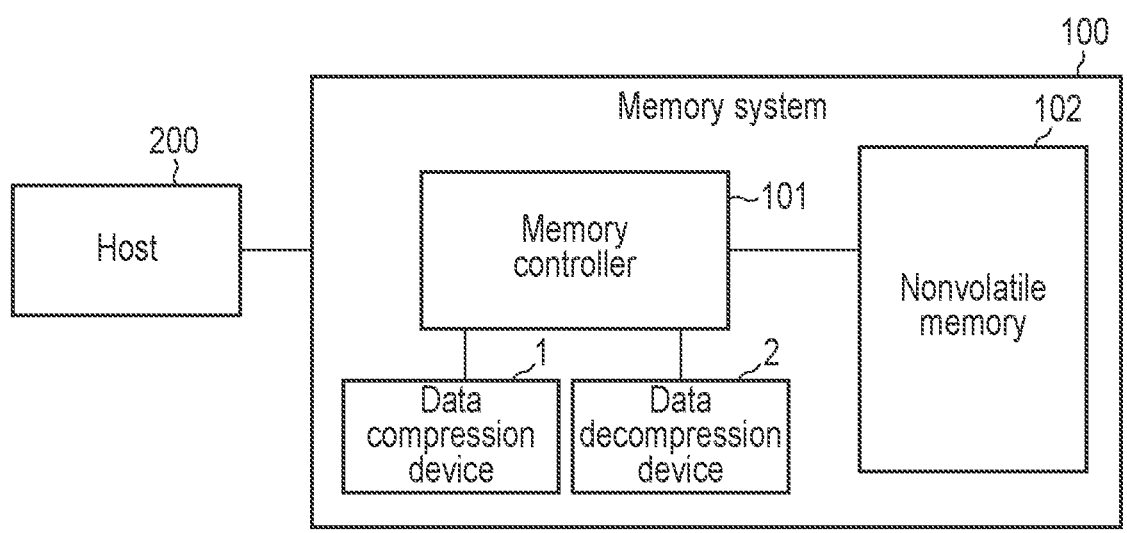
FIG. 13 is a diagram illustrating an example of a configuration of a memory system to which the data compression device according to any one of the first to third embodiments is applied.

FIG. 13 is a diagram illustrating an example of a configuration of a memory system 100 to which the data compression device 1 according to any one of the first to third embodiments is applied.

The memory system 100 includes a memory controller 101, a nonvolatile memory 102, a data compression device 1, and a data decompression device 2, and is connectable to a host 200. The nonvolatile memory 102 is, for example, a NAND flash memory. The memory system 100 is, for example, a solid-state drive (SSD). The memory controller 101 is responsible for operation of the memory system 100. Processing performed by the memory controller 101 may be implemented by dedicated hardware included in the memory controller 101, may be implemented by a CPU included in the memory controller 101 executing a control program (firmware), or may be implemented by a combination of both.

The memory controller 101 is configured to communicate with the host 200 based on a predetermined communication standard. For example, in response to a write command from the host 200, the memory controller 101 performs a write process of writing data to the nonvolatile memory 102.

At the time of the write process, the memory controller 101 supplies the write data designated by the write command to the data compression device 1, and writes compressed data generated by the data compression device 1 to the nonvolatile memory 102. At the time of the write process, the memory controller 101 may perform a predetermined process such as an error correction process or a randomization process on the compressed data generated by the data compression device 1. In this case, the memory controller 101 writes, to the nonvolatile memory 102, data obtained by performing the predetermined process on the compressed data. That is, the memory controller 101 may be configured to write data based on the compressed data generated by the data compression device 1 to the nonvolatile memory 102.

The data decompression device 2 is a device that decompresses data compressed by the dictionary encoding. For example, in response to a read command from the host 200, the memory controller 101 performs a read process of reading compressed data stored in the nonvolatile memory 102, then supplying the compressed data to the data decompression device 2, and transmitting read data resulted from the decompression by the data decompression device 2 to the host 200.

At the time of the read process, the memory controller 101 may read data based on the read command received from the host 200 from the nonvolatile memory 102, perform a predetermined process such as an error correction process or a derandomization process on the data read from the nonvolatile memory 102, and supply data obtained by performing the predetermined process on the data read from the nonvolatile memory 102 to the data decompression device 2. In this case, the data decompression device 2 decompresses the data supplied from the memory controller 101, and data resulted from the decompression by the data decompression device 2 is transmitted to the host 200 as read data. That is, the memory controller 101 may be configured to supply compressed data based on data read from the nonvolatile memory 102 to the data decompression device 2, and the data decompression device 2 may be configured to decompress the compressed data based on the data read from the nonvolatile memory 102.

Here, one or both of the data compression device 1 and the data decompression device 2 may be disposed outside the memory controller 101 or may be included in the memory controller 101.

In the memory system 100, the application of the data compression device 1 according to any one of the first to third embodiments in which the compression ratio performance is improved allows for increase in an amount of data to be accumulated in the nonvolatile memory 102.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data compression device comprising:
   a dictionary match determination unit configured to sequentially store input data in a history buffer, to refer to the history buffer as a dictionary in which past input data is stored to search for a first piece of past input data matching a first piece of new input data in parallel for N (N is a natural number equal to or greater than 2) sequences of search units each having a length of N times one data length, each head of the first piece of new input data being shifted by the one data length, and to output match information including a relative position from the first piece of new input data indicating a position of the first piece of past input data matching the first piece of new input data on the history buffer and a match length from the head;
   an extended matching generator configured to, when at least one match information is output from the dictionary match determination unit and the at least one match information includes the match information of which the match length is N times the one data length, select the match information of which the match length is N times the one data length from the at least one match information, to compare a second piece of past input data subsequent to the first piece of past input data indicated by the match information with a second piece of new input data subsequent to the first piece of new input data of a sequence for which the match information has been output, and to output the match information including a relative position from the second piece of new input data subsequent to the first piece of new input data indicating a position of the second piece of past input data subsequent to the first piece of past input data on the history buffer and a match length from the head;
   a match selector configured to generate compressed data by replacing a part of the input data with the match information using the match information output from the dictionary match determination unit and the match information output from the extended matching generator; and
   a match connector configured to, when a plurality of match information are consecutive in the compressed data generated by the match selector and the plurality of match information each have the relative position of an identical value, replace the plurality of match information in the compressed data with single match information including a relative position of the identical value and a match length obtained by summing the match length of each of the plurality of match information.

2. The data compression device of claim 1, wherein the extended matching generator comprises:
   a history buffer unit configured to store the input data and to output data at an address indicating a storage position of the input data according to designation of the address;
   a subsequent address generator configured to generate the address on the history buffer unit of the second piece of past input data subsequent to the first piece of past input data indicated by the match information of which the match length is N times the one data length using a value of the relative position of the match information and a position of the first piece of new input data of the sequence for which the match information has been output, and to output the address to the history buffer unit;
   an additional match length calculator configured to calculate the match length from the head between the second piece of past input data subsequent to the first piece of past input data that is output from the history buffer unit and the second piece of new input data subsequent to the first piece of new input data of the sequence for which the match information of which the match length is N times the one data length has been output; and
   an extended matching controller configured to,
      when the match length calculated by the additional match length calculator is N times the one data length, make the additional match length calculator continue calculation of the match length for third piece of new input data further subsequent to the second piece of new input data of the sequence for which the match information of which the match length is N times the one data length has been output, and
      when the match length calculated by the additional match length calculator is not N times the one data length, make the additional match length calculator end the calculation of the match length for the third piece of new input data further subsequent to the second piece of new input data of the sequence for which the match information of which the match length is N times the one data length has been output.

3. The data compression device of claim 1, wherein the extended matching generator comprises:
   a subsequent address generator configured to generate an address on the history buffer in the dictionary match determination unit of the second piece of past input data subsequent to the first piece of past input data indicated by the match information of which the match length is N times the one data length using a value of the relative position of the match information and a position of the first piece of new input data of the sequence for which the match information has been output, and to output the address to the dictionary match determination unit;
   an additional match length calculator configured to acquire the second piece of past input data subsequent to the first piece of past input data indicated by the match information of which the match length is N times the one data length from the history buffer in the dictionary match determination unit using the address generated by the subsequent address generator, and to calculate the match length from the head between the second piece of past input data subsequent to the first piece of past input data that is acquired and the second piece of new input data subsequent to the first piece of new input data of the sequence for which the match information has been output; and an extended matching controller configured to,
  when the match length calculated by the additional match length calculator is N times the one data length, make the additional match length calculator continue calculation of the match length for third piece of new input data further subsequent to the second piece of new input data of the sequence for which the match information of which the match length is N times the one data length has been output, and
  when the match length calculated by the additional match length calculator is not N times the one data length, make the additional match length calculator end the calculation of the match length for the third piece of new input data further subsequent to the second piece of new input data of the sequence for which the match information of which the match length is N times the one data length has been output.

4. The data compression device of claim 1, wherein:
the data compression device comprises
  a plurality of dictionary match determination units including the dictionary match determination unit, and
  at least one extended matching generator including the extended matching generator;
the plurality of dictionary match determination units are configured to search for a piece of past input data matching a piece of new input data using different algorithms;
each of the at least one extended matching generator is configured to receive the match information of which the match length is N times the one data length as input from at least one dictionary match determination unit among the plurality of dictionary match determination units; and
the match selector is configured to generate compressed data by replacing a part of the input data with the match information using the match information output from the plurality of dictionary match determination units and the match information output from the at least one extended matching generator.

5. The data compression device of claim 1, wherein the data compression device comprises a plurality of extended matching generators including the extended matching generator, each of which being configured to receive input data of a different sequence out of input data of the N sequences.

6. The data compression device of claim 1, wherein:
the device comprises a plurality of extended matching generators including the extended matching generator;
when the dictionary match determination unit outputs a plurality of match information each of which the match length is N times the one data length, the plurality of match information are separately input to the plurality of extended matching generators.

7. The data compression device of claim 1, wherein:
the data compression device comprises
  a plurality of dictionary match determination units including the dictionary match determination unit, and
  a plurality of extended matching generators including the extended matching generator, which are provided on a one-to-one basis with the plurality of dictionary match determination units;
the plurality of dictionary match determination units are configured to search for a piece of past input data matching a piece of new input data using different algorithms; and
the plurality of extended matching generators are configured to mutually transmit and receive information regarding selection of one match information from the match information for the N sequences, and to avoid same match information being redundantly selected by two or more of the plurality of extended matching generators.

8. A memory system comprising:
a nonvolatile memory; and
a controller, wherein
the controller is configured to control the nonvolatile memory and includes the data compression device of claim 1 configured to compress data to be written into the nonvolatile memory.

9. A method for compression of data to be written into a nonvolatile memory, the method comprising:
performing a first process of sequentially storing input data in a history buffer, to refer to the history buffer as a dictionary in which past input data is stored to search for a first piece of past input data matching a first piece of new input data in parallel for N (N is a natural number equal to or greater than 2) sequences of search units each having a length of N times one data length, each head of the first piece of new input data being shifted by the one data length, and outputting match information including a relative position from the first piece of new input data indicating a position of the first piece of past input data matching the first piece of new input data on the history buffer and a match length from the head;
when at least one match information is output from the performing the first process and the at least one match information includes the match information of which the match length is N times the one data length, performing a second process of selecting the match information of which the match length is N times the one data length from the at least one match information, comparing a second piece of past input data subsequent to the first piece of past input data indicated by the match information with a second piece of new input data subsequent to the first piece of new input data of a sequence for which the match information has been output, and outputting the match information including a relative position from the second piece of new input data subsequent to the first piece of new input data indicating a position of the second piece of past input data subsequent to the first piece of past input data on the history buffer and a match length from the head;
performing a third process of generating compressed data by replacing a part of the input data with match information using the match information output from the performing the first process and the match information output from the performing the second process; and
when a plurality of match information are consecutive in the compressed data generated by the performing the third process and the plurality of match information each have the relative position of an identical value, performing a forth process of replacing the plurality of match information in the compressed data with single match information including a relative position of the identical value and a match length obtained by summing the match length of each of the plurality of match information.

10. The method of claim 9, wherein the processing the second process includes:
generating an address on the history buffer of the second piece of past input data subsequent to the first piece of past input data indicated by the match information of which the match length is N times the one data length using a value of the relative position of the match information and a position of the first piece of new input data of the sequence for which the match information has been output, and outputting the address to the processing the first process;
acquiring the second piece of past input data subsequent to the first piece of past input data indicated by the match information of which the match length is N times the one data length from the history buffer using the generated address, and calculating the match length from the head between the second piece of past input data subsequent to the first piece of past input data that is acquired and the second piece of new input data subsequent to the first piece of new input data of the sequence for which the match information has been output;
when the calculated match length is N times the one data length, making the calculating the match length continue calculation of the match length for third piece of new input data further subsequent to the second piece of new input data of the sequence for which the match information of which the match length is N times the one data length has been output; and
when the calculated match length is not N times the one data length, making the calculating the match length end the calculation of the match length for the third piece of new input data further subsequent to the second piece of new input data of the sequence for which the match information of which the match length is N times the one data length has been output.

11. The method of claim 9, wherein:
the method comprises
a plurality of processing the first process, and
at least one processing the second process;
the plurality of processing the first process include searching for a piece of past input data matching a piece of new input data using different algorithms;
each of the at least one processing the second process includes receiving at least one the first match information of which the match length is N times the one data length as input from a plurality of the first match information; and
the processing the third process includes generating compressed data by replacing a part of the input data with the match information using the match information output from the plurality of processing the first process and the match information output from the at least one processing the second process.

12. The method of claim 9, wherein the method comprises a plurality of processing the second process, each of which include receiving input data of a different sequence out of input data of the N sequences.

13. The method of claim 9, wherein the method comprises a plurality of processing the second process;
when the processing the first process outputs a plurality of match information each of which the match length is N times the one data length, the plurality of match information are separately input to the plurality of processing the second process.

14. The method of claim 9, wherein:
the method comprises
a plurality of processing the first process, and
a plurality of processing the second process, which are provided on a one-to-one basis with the plurality of processing the first process;
the plurality of processing the first process include searching for a piece of past input data matching a piece of new input data using different algorithms; and
the plurality of processing the second process include mutually transmitting and receiving information regarding selection of one first match information from the first match information for the N sequences, and avoiding same match information being redundantly selected by two or more of the plurality of processing the second process.

* * * * *